(12) United States Patent
Ferguson

(10) Patent No.: US 7,996,737 B2
(45) Date of Patent: Aug. 9, 2011

(54) FINGERPRINTED CIRCUITS AND METHODS OF MAKING AND IDENTIFYING THE SAME

(75) Inventor: Michael Ian Ferguson, Glendale, CA (US)

(73) Assignee: California Institute of Technology, Pasadena, CA (US)

( * ) Notice: Subject to any disclaimer, the term of this patent is extended or adjusted under 35 U.S.C. 154(b) by 780 days.

(21) Appl. No.: 10/584,592

(22) Filed: Sep. 11, 2007

(65) Prior Publication Data

US 2010/0264204 A1 Oct. 21, 2010

(51) Int. Cl.
*G01R 31/28* (2006.01)
(52) U.S. Cl. ....................................................... 714/725
(58) Field of Classification Search .................. 714/745, 714/725
See application file for complete search history.

(56) References Cited

U.S. PATENT DOCUMENTS

| | | | | |
|---|---|---|---|---|
| 5,638,381 A * | 6/1997 | Cho et al. | ....................... | 714/732 |
| 5,993,055 A * | 11/1999 | Williams | ....................... | 714/732 |
| 6,167,547 A * | 12/2000 | Senechal et al. | .............. | 714/732 |
| 6,928,606 B2 * | 8/2005 | Savaria et al. | ................ | 714/797 |
| 7,036,059 B1 * | 4/2006 | Carmichael et al. | .......... | 714/725 |
| 7,418,641 B2 * | 8/2008 | Drake et al. | ................... | 714/726 |
| 7,444,565 B1 * | 10/2008 | Haight | .......................... | 714/725 |
| 7,526,698 B2 * | 4/2009 | Dalton et al. | .................. | 714/733 |
| 2003/0079165 A1* | 4/2003 | Ffrench et al. | ................. | 714/726 |
| 2007/0300115 A1* | 12/2007 | Datta et al. | ..................... | 714/738 |

* cited by examiner

*Primary Examiner* — James C Kerveros
(74) *Attorney, Agent, or Firm* — Steinfl & Bruno LLP

(57) ABSTRACT

A circuit having a fingerprint for identification of a particular instantiation of the circuit is disclosed. The circuit may include a plurality of digital circuits or gates. Each of the digital circuits or gates is responsive to a configuration voltage applied to its analog input for controlling whether or not the digital circuit or gate performs its intended digital function and each of the digital circuits or gates transitioning between its functional state and its at least one other state when the configuration voltage equals a boundary voltage. The boundary voltage varies between different instantiations of the circuit for a majority of the digital circuits or gates and these differing boundary voltages serving to identify (or fingerprint) different instantiations of the same circuit.

7 Claims, 16 Drawing Sheets

FINGERPRINTED CIRCUITS AND METHODS OF MAKING AND IDENTIFYING THE SAME

GOVERNMENT CONTACT INFORMATION

This invention was made under NASA contract NAS7-03001 and therefore the government has certain rights in this technology.

CROSS REFERENCE TO RELATED APPLICATIONS

This application is related to U.S. patent application Ser. No. 10/526,613 and filed Apr. 18, 2005 on entitled "Methods of Camouflaging the Functions of Electronic Circuits" and filed, the disclosure of which is hereby incorporated herein by reference.

TECHNICAL FIELD

Described is a method by which variations due to manufacturing tolerances can be used to uniquely identify a fabricated Integrated Circuit (IC). The disclosed techniques can be used to fingerprint even non-integrated circuits or circuits employing a plurality of ICs arranged in a desired configuration. Using the disclosed technology one instantiation of a circuit can be readily distinguished from another instantiation of the same functionally identical or equivalent circuit.

BACKGROUND OF THE INVENTION

Identification techniques are well known in the art. For example, an IC can be fabricated with fused links or a programmable read only memory (ROM), that are programmed after the IC is manufactured, to thereby imbed a serial number in the IC. However, the serial number is easily readable in such prior art devices and moreover it is relatively easy to replicate the IC with the same imbedded serial number.

Fingerprinting is different. Fingerprints can be read, but they cannot (or virtually cannot) be replicated. The present invention relates to fingerprinting an IC, for example, so that it can be uniquely identified compared to other ICs made at the same time even using common masks and/or semiconductor dies.

The present invention can be used to fingerprint even non-integrated circuits or circuits employing a plurality of ICs arranged in a desired configuration.

BRIEF DESCRIPTION OF THE INVENTION

In one aspect the present invention provides a circuit having a fingerprint for identification of a particular instantiation of the circuit. The circuit includes a plurality of digital circuits or gates, the plurality digital circuits or gates each having an analog input and wherein each of said digital circuits or gates has at least one functional state wherein the corresponding digital circuit or gate performs an intended digital function and at least one other state wherein said intended digital function is not performed, each of said digital circuits or gates being responsive to a configuration voltage applied to its analog input for controlling whether or not said digital circuit or gate performs its intended digital function, each of said digital circuits or gates transitioning between its functional state and its at least one other state when the configuration voltage corresponds to a boundary voltage, the boundary voltages varying between different instantiations of said circuit for a majority of said digital circuits or gates. The circuit also includes a plurality of digital to analog converters for generating configuration voltages each applied to one or more of said plurality of digital circuits or gates.

In another aspect the present invention provides a method of uniquely identifying instantiations of functionally identical circuits. This method includes representing small manufacturing tolerance related differences between particular instantiations of the functionally identical circuits as a plurality of numbers, each number being associated with a particular gate or a group of gates of an instantiation of said functionally identical circuits; and determining said numbers for a particular instantiation of said functionally identical circuits, said numbers serving to uniquely identify said particular instantiation of said functionally identical circuits

DESCRIPTION OF THE FIGURES OF THE DRAWING

FIG. 4c is an overlay of FIGS. 4a and 4b (without the hatched regions for clarity purposes) showing the variability of the starting voltages and ending voltages for the respective functions of each of the eight gates.

DETAILED DESCRIPTION OF THE INVENTION

Figure 1:
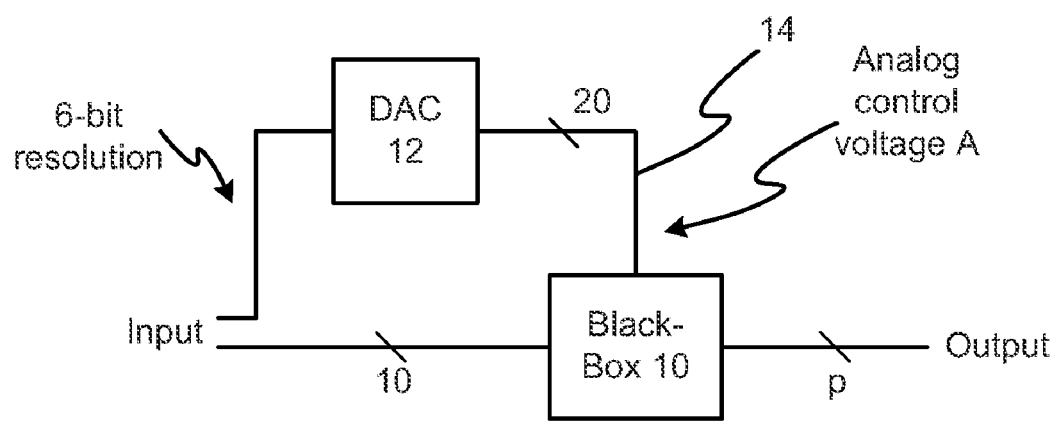
FIG. 1 is a block diagram of a gate or circuit which performs some desired function when an analog control or configuration voltage applied thereto falls with a particular range of voltages.

The disclosed method involves the configuring of a digital circuit by a vector of analog values, preferably, but not necessarily, voltage. FIG. 1 depicts a simple circuit or gate (called a 'black box' as its particular functionality is not important to an understanding of the present invention). The black box gate or circuit 10 has at least one typically digital input and has at least one typically digital output. An analog control voltage A is applied to another input of gate or circuit 10. The magnitude of the applied voltage A controls the function f (or as will be seen, functions $f_0, f_1, \ldots f_n$) which the gate or circuit 10 performs. When the magnitude of the applied voltage A falls within a particular range which the gate or circuit 10 performs some desired or desirable digital function f.

Figure 13:
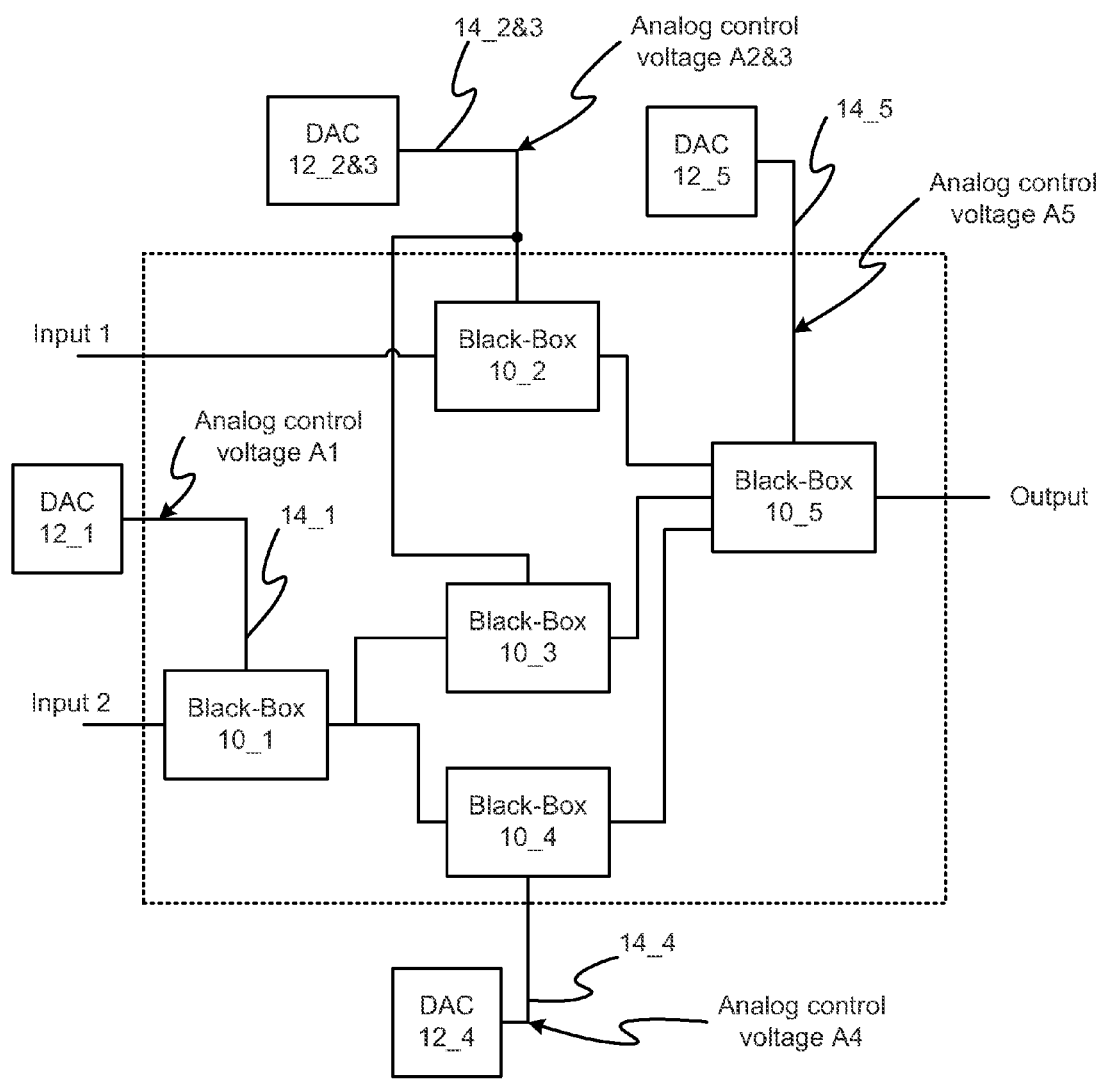
FIG. 13 is a block diagram of a digital circuit having a plurality of black box circuits $10_1$-$10_5$ having analog voltages supplied by a series of DACs $14_1$-$14_5$. Note that of black box circuits $10_2$ and $10_3$ are controlled by a common DAC $14_{2\&3}$, in the manner described with reference to FIGS. 5-7.

The gate or circuit 10 has a feature that when fabricated yields a particular digital function of a set of digital inputs (I) and digital outputs (Q) when configured correctly with a single, or preferably a set, of analog control or configuration inputs (A), where I, Q and A are vectors containing a set of individual signals. A simple black-box gate might have a single analog control or configuration input A, whereas a more complex gate or circuit 10 preferably has many control or configuration inputs $A_0, A_1, \ldots A_{m-1}$ (see FIG. 13 which only shows five gates or circuits $10_1$-$10_5$—a real life complex circuit could have hundreds, thousand or even many more gates or circuits $10_1$-$10_m$).

Figure 2:
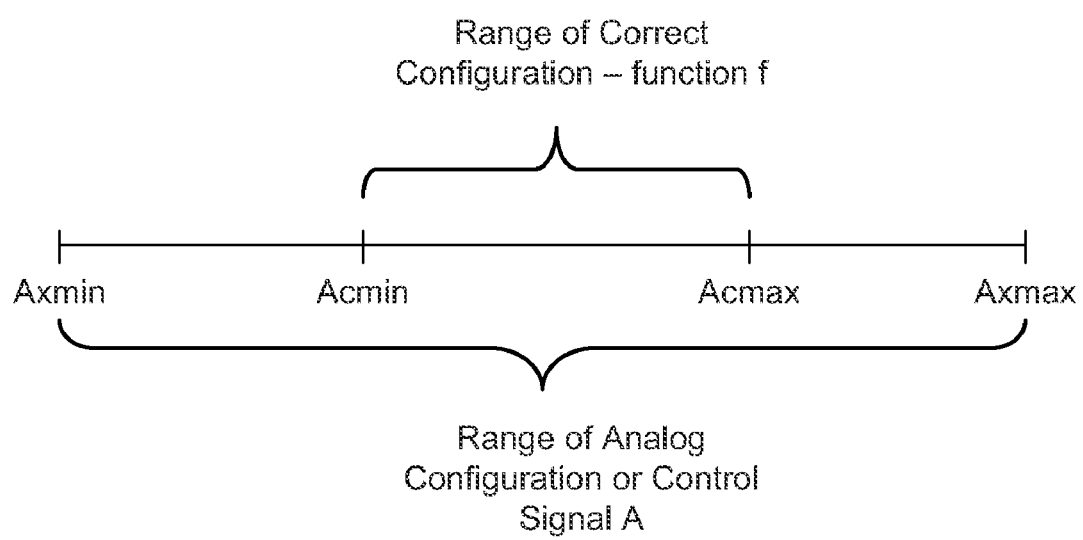
FIG. 2 depicts the relationship between the possible values of an analog control or configuration voltage A and the function performed by gate or circuit.

Each of the analog inputs A are given in the range between some minimum value ($Ax_{min}$) and some maximum value ($Ax_{max}$) and each input has a range ($Ac_{min}$ to $Ac_{max}$) over which the correct circuit function will be exhibited subject to the constraint that $Ac_{min} \geq Ax_{min}$ and $Ac_{max} \leq Ax_{max}$. This relationship is shown pictorially by FIG. 2. In FIG. 2 the range of the analog configuration signal is shown as the horizontal axis with the minimum at $Ax_{min}$ and maximum at $Ax_{max}$. This axis indicates that for some particular analog configuration signal A (an arbitrary signal in the analog configuration vector A, numerated as $A_0$ to $A_{m-1}$ for an m-signal vector) the input should not be below the value $Ax_{min}$, nor above the value $Ax_{max}$. When the analog configuration or control signal A falls in the $Ac_{min}$ to $Ac_{max}$, the gate or circuit 10 performs some desired function f. When outside that range, the gate or circuit 10 performs either a non-desirable function or an indeterminate function. The reference here (and hereinafter) to gate or circuit 10 is intended to be general enough to refer to the individual black box circuits or gates $10_1$-$10_5$ of FIG. 13 and/or to the soon to be described polymorphic gates and circuits, unless the context dictates otherwise.

The functioning of an individual gate or circuit (i.e. a group of gates) 10 is controlled by the analog voltage A which in turn is preferably generated by a Digital to Analog Converter (DAC) 12. In order for the individual gate or circuit 10 to perform a desired function f then its associated DAC 12 must produce a voltage which falls in the range of $Ac_{min}$ to $Ac_{max}$. In order to determine the magnitude of $Ac_{min}$ and/or $Ac_{max}$ with some reasonable degree of precision, then DAC 12 must have a sufficient number of bits to provide a desirable amount of resolution. The DAC 12 shown in FIG. 1 is depicted as a six-bit DAC, but apart from circuit complexity issues, the more precision the DAC 12 has the better since it yields greater precision in fingerprinting a particular gate or circuit 10. So six bits here is just exemplary and in all likelihood the DAC 12 will have more than six bits in most real world applications. Of course, the numbers applied to the various DACs to generate their analog output voltages are likewise multi-bit numbers.

Individual gates or circuits 10, when manufactured, inherently have measurable fluctuations in the values of $Ac_{min}$ and $Ac_{max}$ when measured as chip-to-chip variations for exactly the same individual gate or circuit 10 as well as within-chip variations for multiple instances of the same circuit topology which produces gate or circuit 10. On a given chip, for example, there may be hundreds of thousands to many millions of individual gates. If individual gates or groups of individual gates are each controlled by a separate control or configuration signal $A_0, A_1, A_{m-1}$, then each of these not only must fall within its range of $Ac_{min}$ to $Ac_{max}$ for the respective circuits to operate properly, the respective values of $Ac_{min}$ and $Ac_{max}$ for each separate control or configuration signal $A_0, A_1, \ldots A_{m-1}$ each associated with either an individual gate groups of individual gates will serve to uniquely identify or fingerprint a particular instantiation of a chip (or a particular instantiation of a complex circuit comprising a thusly configured gates which are not integrated).

Figure 3:
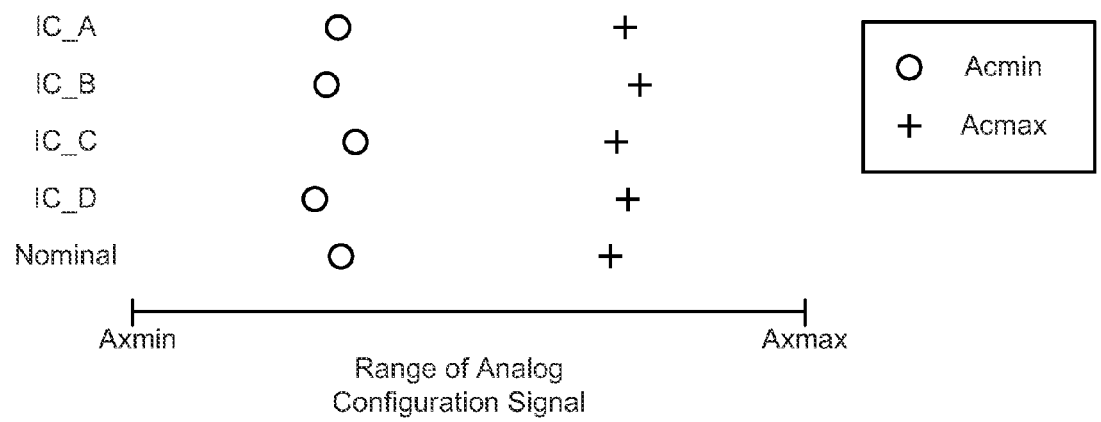
FIG. 3 is a pictorial representation of the nominal minimum value of the analog signal A is shown in relation to four hypothetical empirical values measured from other circuits $IC_A$-$IC_D$ of identically designed netlists of transistors.

A pictorial representation of the effect of the variance of $Ac_{min}$ and $Ac_{max}$ is shown in FIG. 3. In this figure the nominal minimum value of the analog signal A is shown in relation to four hypothetical empirical values measured from other circuits $IC_A$-$IC_D$ of identically designed netlists of transistors. From the FIG. 3 it is clear that there are variations in the lower and upper bounds of the configuration region $Ac_{min}$ and $Ac_{max}$ for each of the circuits $IC_A$-$IC_D$. These variations are due to manufacturing tolerances that manifest themselves as physically evident changes in the fabricated circuit, but from a digital standpoint the circuits $IC_A$-$IC_D$ are functionally identical (or at least equivalent). So if a circuit is examined using an electron microscope, for example, very small differences can be seen chip-to-chip for a given circuit as well as with-in a single chip for multiple instance of some common reoccurring gate or circuit configuration. One or preferably both of $Ac_{min}$ and $Ac_{max}$ are different than their respective endpoint values $Ax_{min}$ and $Ax_{max}$ so that the values of $Ac_{min}$ and $Ac_{max}$ for each controlled gate or circuit 10 is measurable. Nevertheless, the circuits $IC_A$-$IC_D$ are functionally identical from the aspect of the normal use which the circuit is intended to perform. But their fingerprints in terms of these differing values of $Ac_{min}$ and $Ac_{max}$ can be used to distinguish one instantiation of the circuit from another instantiation of the circuit.

A circuit is assembled as discrete components or more commonly as an integrated circuit (IC) in a semiconductor technology such as Complementary Metal Oxide Semiconductor (CMOS) having many instances of individual gates or circuits 10 each configured by an analog control voltage A whose respective values of $Ac_{min}$ and $Ac_{max}$ serve to uniquely identify or fingerprint a particular chip. Because the values of $Ac_{min}$ and $Ac_{max}$ for each for each controlled gate or circuit 10 result from manufacturing tolerances outside of manufacturing control, each individual chip will have many gates or circuits 10 each of which has is own unique analog control or configuration voltage A which (i) must be set correctly (between $Ac_{min}$ and $Ac_{max}$) and (ii) whose respective values of $Ac_{min}$ and $Ac_{max}$ uniquely identify the chip in question. These voltages for each instance of a circuit 10 are generated by the associated DACs 12. So if the chip has m analog voltage controlled circuits 10, then each of the m DACs 12 must be loaded with a digital value which generates a respective voltage between $Ac_{min}$ and $Ac_{max}$ for the chip to function properly and the digital values in each of the m DACs 12 which cause the respective gates or circuits 10 to malfunction when stepping away from a nominal when the chip function properly can be used to uniquely identify or fingerprint the chip in question.

The discussion so far has been primarily in terms chips and particularly CMOS chips as there are commonly used in the manufacture of digital devices. But there is no reason why this fingerprinting scheme need be limited to chips since it should work well with anything (and everything) which is subject to manufacturing tolerances, which certainly includes discrete circuits.

The discussion so far has also been primarily in terms of a circuit or gate 10 having one desirable function f and either one or two voltage range(s) for the analog control or configuration voltage A for which the function is undesirable or indeterminate. However, as is disclosed in the aforementioned copending application Ser. No. 10/526,613, useful polymorphic gates can be made using evolutionary algorithms (EA) that are used to create embodiments of electronic circuits using varying topologies of transistors, various transistor lengths and widths. Each such embodiment of a polymorphic gate is defined as a netlist which describes the network of connections between transistors in a simple form. An embodiment created by the EA has a feature that when fabricated yields perhaps only one particular digital function f, but more preferably a range functions $f_0, f_1, \ldots f_n$ each separated by regions of indeterminate operation x as function of the magnitude of the analog control or configuration voltage A.

FIGS. 4a and 4b depict the effect of varying an analog control or configuration voltage A for eight polymorphic digital circuits fabricated on two separate ICs, chip 1 (FIG. 4a) and chip 2 (FIG. 4b). The range of the control or configuration voltage A is shown from 0 Volt on the left to 1.8 Volts on the right. Hatched regions indicate undefined or unstable functionality. FIG. 4c is an overlay of FIGS. 4a and 4b (without the hatched regions for clarity of illustration) showing the variability of the starting voltages ($Ac_{min}$) and ending voltages ($Ac_{max}$) for the respective functions of each of the eight gates. The gates are identified by the numbers 82, 87, 38, 100, 30, 50, 44 and 59.

The boundaries of functionality for the analog control or configuration voltage A were tested and are indicated by the regions marked f0 . . . fn for chips 1 and 2. These regions correspond to separate potentially useful functions $f_0, f_1, \ldots f_n$ that each of the polymorphic gates can perform depending on the value of the analog control or configuration voltage A applied thereto. So each gate can be thought of as being a gate or circuit 10 as in FIG. 1 having an associated DAC 12 for generating the analog control or configuration voltage A, but instead of having only one useful function f, each polymorphic gate can have several possible functions $f_0, f_1, \ldots f_n$ and has a lower and upper bounds of an associated configuration region $Ac_{min}$ and $Ac_{max}$ for each useful function $f_0, f_1, \ldots f_n$.

Note polymorphic circuit 82. It has seven different possible functions f0-f6. The value of $Ac_{min}$ for f6 is not distinguishable from $Ax_{max}$ but the value of $Ac_{min}$ is measurable as are the values of $Ac_{min}$ and $Ac_{max}$ for each of the functions f0-f5. So for polymorphic circuit 82, there are thirteen different values of the analog control or configuration voltage A which give a signature or fingerprint to that circuit 82.

Other gates or circuits represented by FIGS. 4a and 4b can have different numbers of possible functions and therefore different numbers of values of the analog control or configuration voltage A which give a signature or fingerprint to that gate or circuit. So increasing the number of functions that a particular gate or circuit might perform just as increasing the number of circuits controlled by an analog control or configuration voltage A in a given chip (or discrete circuit) increases the complexity of the problem (by increasing the number of variables) thereby significantly reducing the possibility that any two chips (or discrete circuits) might have the same fingerprint (where each and every possible value of $Ac_{min}$ and $Ac_{max}$ for each useful function $f_0, f_1, \ldots f_n$. of each and every separate gate or circuit having analog voltage control align perfectly within the precision of the DACs 12). It is rather easy to create sufficient complexity so that the chances of two chips (or discrete circuits) might have the same fingerprint will be less than one chance in $10^{40}$.

The measurability of the fluctuations in the values of $Ac_{min}$ and $Ac_{max}$ whether measured as chip-to-chip variations as well as within-chip variations for the same circuit topology depends on (i) the precision of the DACs 12 and (ii) the standard deviations of the individual the fluctuations in the values of $Ac_{min}$ and $Ac_{max}$. Note the overlay diagram of FIG. 4a and note more particularly polymorphic gate or circuit 87. Note functions f2, f3 and f4 of that gate and in particular note the variations in $Ac_{min}$ and $Ac_{max}$ for those functions. One of the advantages of designing gates of a polymorphic structure is that circuits created through the use of EA can be made so that they inherently have measurable fluctuations in the values of $Ac_{min}$ and $Ac_{max}$ when measured as chip-to-chip variations as well as within-chip variations for the same circuit topology. At the same time, there needs to exist a nominal value of A for each an analog controlled gate or circuit 10 such that the analog controlled gate or circuit 10 functions with a desired function f (which in the case of a polymorphic gate is a selected one of functions $f_0, f_1, \ldots f_n$) so that the DAC can be loaded with a number corresponding to the nominal value of A which enables the desired function f. Since the circuit in question will have many, many gates or circuits $10_{1-m}$ with associated DACs $12_{1-m}$, then key space which enables proper operation of the overall complex circuit 10 become rather large. If the key is not known, then the circuit 10 will not function properly.

Note that all instantiations of the overall complex circuit 10 will have the same key (i.e. the same nominal values of $A_{1-m}$), but their fingerprints will be different since they will not have the same values of $Ac_{min}$ and $Ac_{max}$ for each function f of each gate or circuit $10_{1-m}$.

By the use of an evolutionary algorithm, such as that described in the aforementioned copending U.S. patent application Ser. No. 10/526,613, very tightly constrained design topologies can be found that provide consistent circuit/gate functionality in the middle of the configured range ($Ac_{min}$ to $Ac_{max}$) but have ill-defined configuration range boundaries ($Ac_{min}$ and $Ac_{max}$) when fabricated, the resulting circuits have both gross functionality that can be designated a priori to circuit fabrication and have fine detail that can be measured and are unique to each fabricated IC.

Example of Unique Functionality:

A set of circuits were evolved that exhibited multiple digital functions depending on the value of a static analog configuration signal. These circuits were fabricated by Taiwan Semiconductor Manufacturing Corporation (TSMC) utilizing a 0.18 micron feature size. Each digital circuit had two inputs, one output and one analog configuration input. The digital circuits were tested for functionality and the results are shown graphically in FIGS. 4a-4c described above and in tabular form in Table I appended hereto. FIGS. 4a and 4b show the minimum and maximum boundaries for eight separate digital circuits (arbitrarily labeled in the FIGS. 4a-4c) and for the different functions of each circuit. The overlay view of FIG. 4c shows how the variation between chip 1 and chip 2 manifests itself with regard to the configuration boundaries. Examination of the overlapping regions leads to the conclusion that there are several boundaries of functionality that can be easily distinguished even without a very high precision DAC 12.

Uniqueness:

A further aspect of this technique is that the uniqueness of the circuits grows as the product of all boundaries of the analog control or configuration voltages on signal wires 14. In FIG. 2 there are only two boundaries, a minimum and a maximum. In principle there is no limit to the number of boundaries. In the example shown in FIGS. 4a and 4b there are thirteen boundaries shown for circuit 82, and there could be more still, depending on the solution found by the EA.

Figure 5:
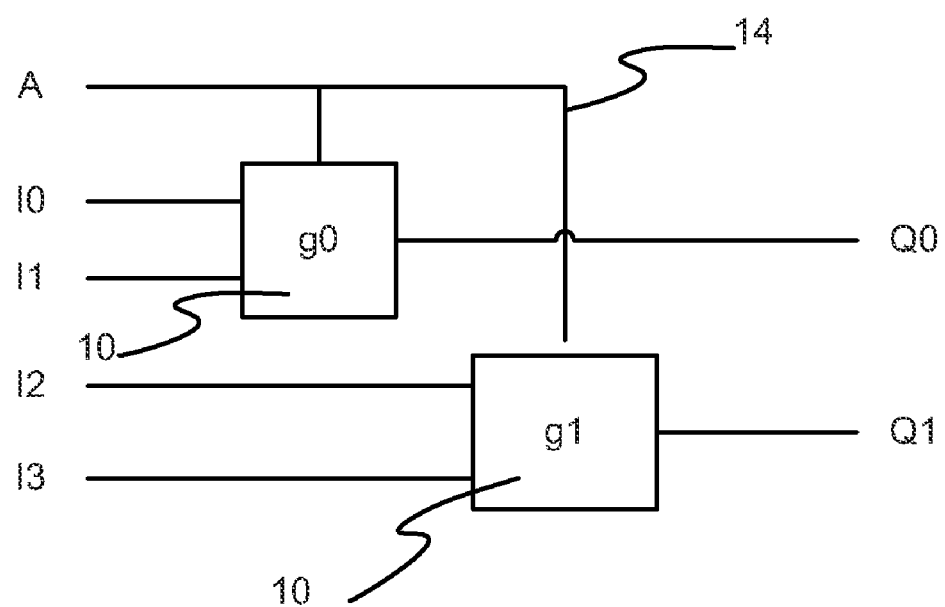
FIG. 5 depicts an embodiment where example of a single analog control signal wire 14 configures two different digital circuits or gates, g0 and g1.
Figure 6:
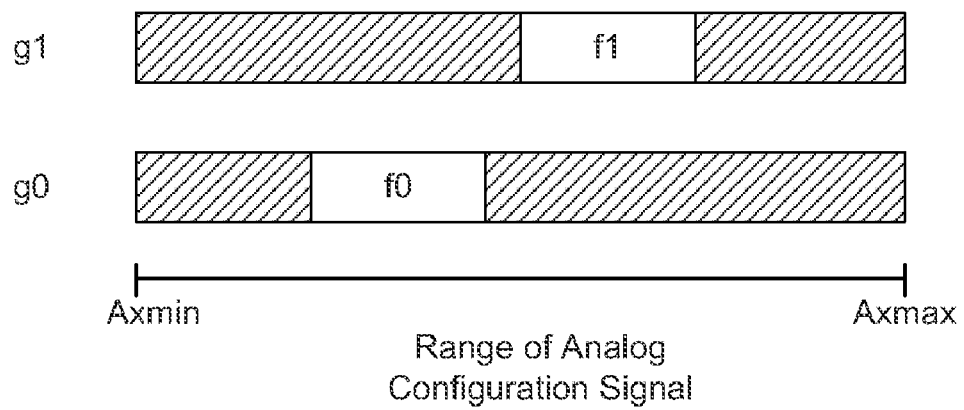
FIG. 6 depicts the different functional ranges for the two gates represented in FIG. 5.
Figure 7:
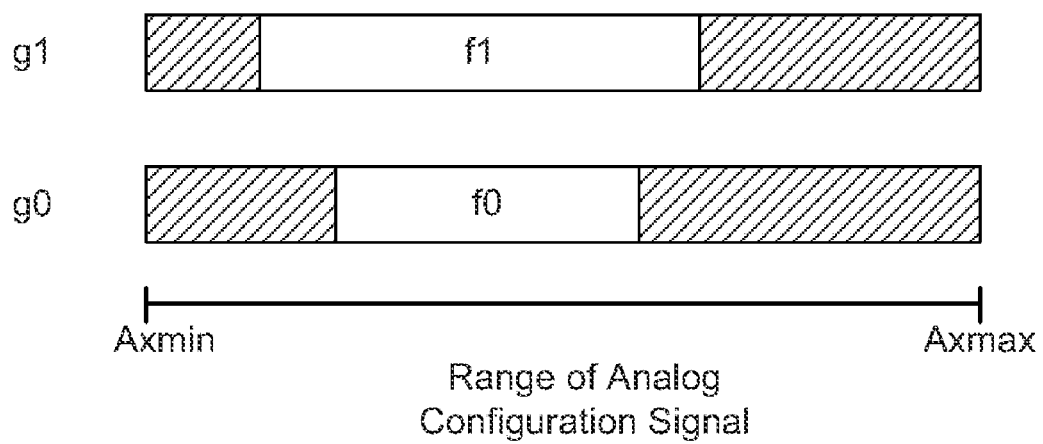
FIG. 7 is similar to FIG. 6 in that it depicts the different functional ranges for the two gates represented in FIG. 5, but this figure depicts more generalized situation in which the boundaries of two different functional regions of two different circuits overlap.
Figure 8:
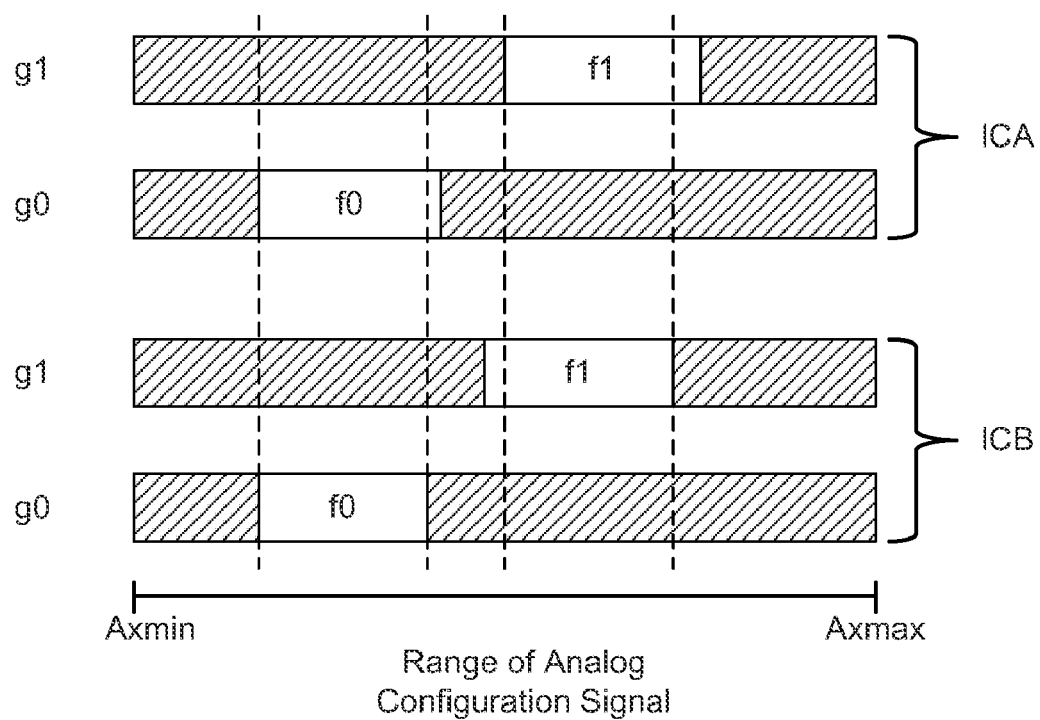
FIG. 8 depicts example of two different functional regions on the same signal wire connected to two different analog-configurable digital circuits. Also shown is the difference between two different ICs, $IC_A$ and $IC_B$. The dashed lines help show how the empirically measured boundaries of the different functional regions are different between different ICs.

An alternative technique for increasing the number of boundaries seen by a single signal wire 14 from a single DAC 12 would be to connect the DAC 12 to more than one digital circuit. In this manner signal several boundaries could be probed. An example of this is shown in FIG. 5. In this figure signal A, on line 14 is connected to both gates or circuits g0 and g1. The functional map for these two gates is shown in FIG. 6. In FIG. 6 it is shown that as the value of signal A, is increased from $Ax_{min}$ to $Ax_{max}$, the system of the two gates/circuits goes through two different functional regions, at first both outputs are undefined, then f0 is enabled for circuit/gate g0, then becomes undefined, then f1 is enabled on circuit/gate g1, then it becomes undefined again. In general, the two regions need not be separate, but may overlap to any degree, such as shown in FIG. 7. In the general manner described above, multiple gates can be connected to a single signal wire 14. The effect of this is the same that as in the empirical tests shown in FIGS. 4a-4c above in that there are measurable differences between the functional boundaries as observed in different functionally-identical ICs. This effect is shown more clearly in FIG. 8 for the two-gate example of FIG. 5.

Figure 4:
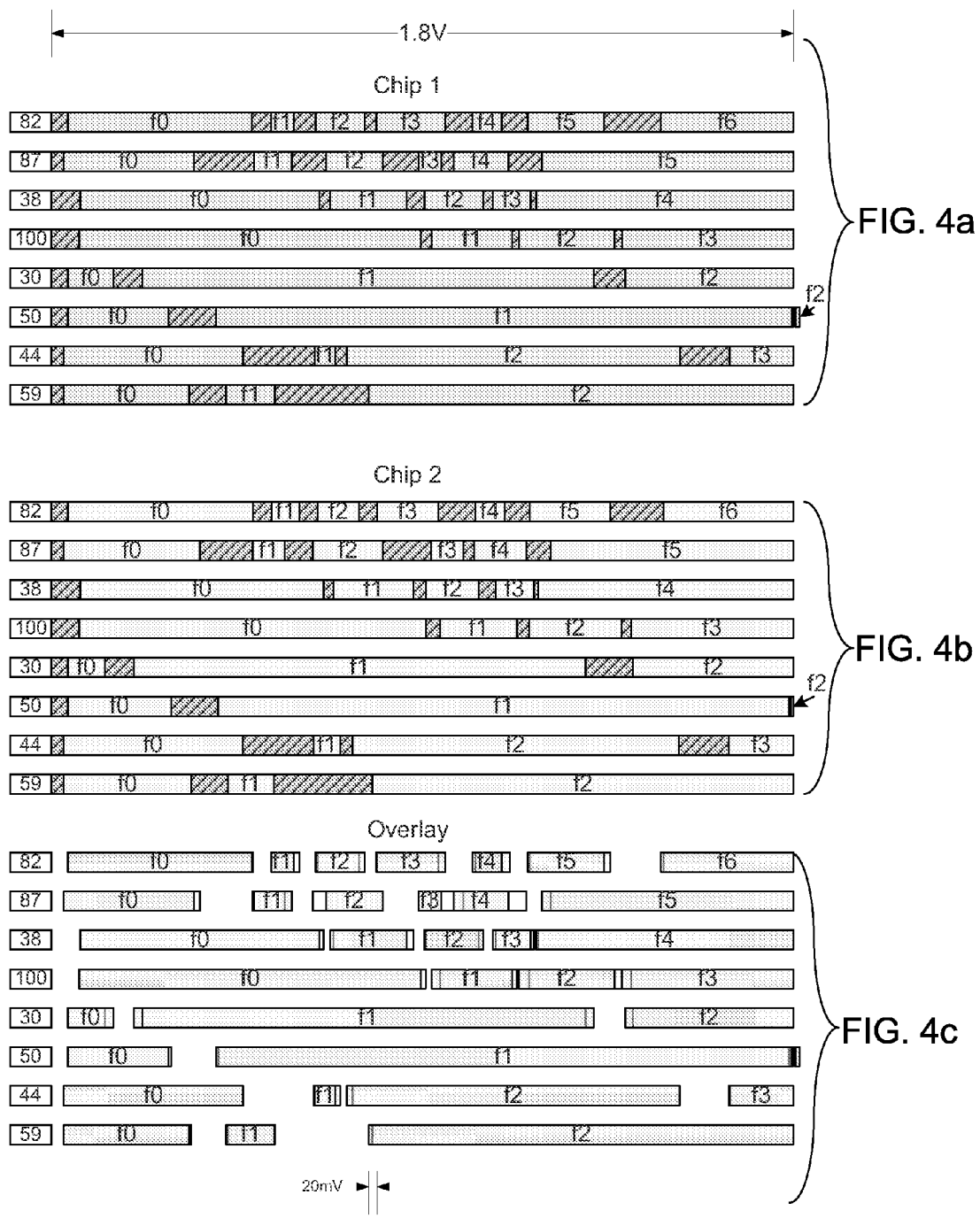
FIGS. 4a-4c depicts the effect of varying an analog control or configuration voltage A for eight polymorphic digital circuits fabricated on two separate ICs, chip 1 (FIG. 4a) and chip 2 (FIG. 4b). The boundaries of functionality were tested and are indicated by the regions marked f0 . . . fn for chips 1 and 2. The range of the analog input is shown from 0 volts on the left to 1.8 volts on the right. Hatched regions indicate undefined or unstable functionality.
Figure 9:
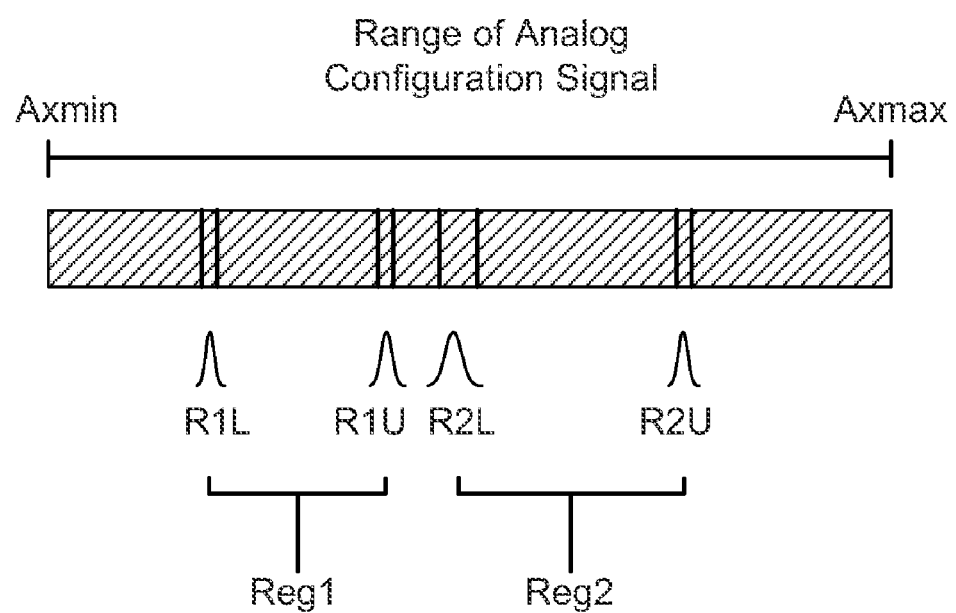
FIG. 9 depicts the functional regions of the two gate example for FIG. 5. There are two functional regions here, Reg1 and Reg2. There is a lower and an upper boundary for each functional region indicated by $Rx_L$ and $Rx_U$.

The functional boundaries along the signal wire 14 of FIG. 4 is shown in FIG. 9. In FIG. 9 there are two functional regions shown, Reg1 and Reg2. For the upper and lower boundaries of each of those regions there are two lines indicating the values for the respective functional boundary for two different ICs. In general there will be a distribution of boundary values for each functional region and it is expected that the distribution will be Gaussian. Also indicated in FIG. 9 is the anticipated Gaussian shape of the distribution for that boundary. For each functional boundary (lower and upper) there will be an observed distribution of values and a chi-square fit to the data will result in a different sigma of that distribution. The values of sigma will determine the estimated boundaries within which the fabricated integrated circuits will perform the given function. It is also notable that the width of each functional region (i.e. the difference between $Rx_L$ and $Rx_U$— which correspond to $Ac_{min}$ and $Ac_{max}$ discussed above—for the region under consideration) should be designed or selected so that it is larger than the sigma of the boundary distributions, otherwise there is no guarantee that the gross functionality will be exhibited by any particular IC and makes testing much more difficult.

Figure 10:
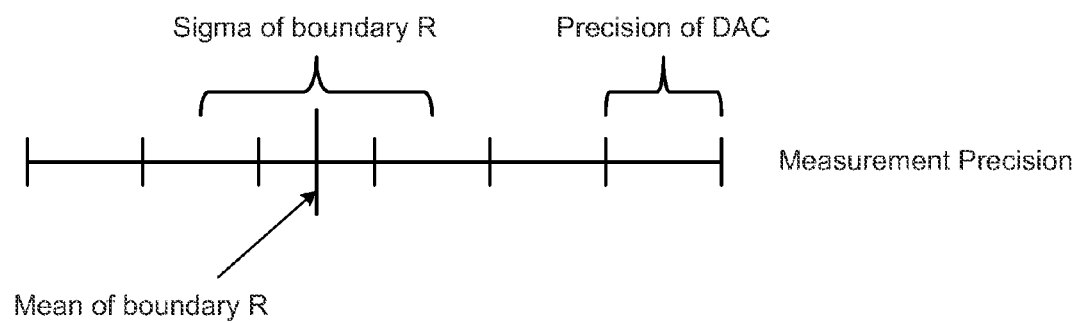
FIG. 10 is a representation of the measurement problem with precision given by the hatched number line and the mean and sigma shown along that line.

Multiplicity of the Signature:

The ability to extract a signature from a set of signal domains such as that shown in FIG. 9 depends on two parameters, the sigma of the boundary value distribution, and the sigma of the measurement resolution. This is illustrated in FIG. 10 in which a mean boundary R is shown in between two measurement points and the sigma of the distribution of the boundary R (shown with infinite precision) is shown as subtending two measurement points (as defined by the precision of the DAC 12). In this case the level of detail obtainable for that element of the signature is limited to only two values. In general, the level of detail in the signature is defined as the number of measurement points (and hence the precision of or number of bits in the DAC 14) subtended by the sigma of the boundary value distribution.

Figure 11:
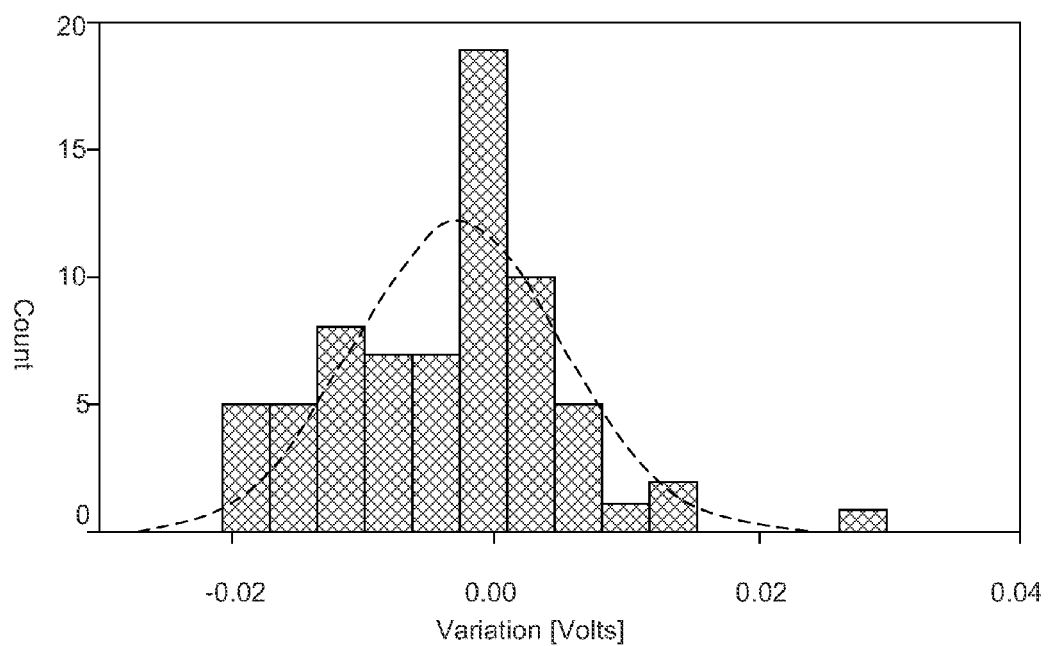
FIG. 11 is a graph showing the distribution of boundary values around the nominal value for functional boundaries.
Figure 16:
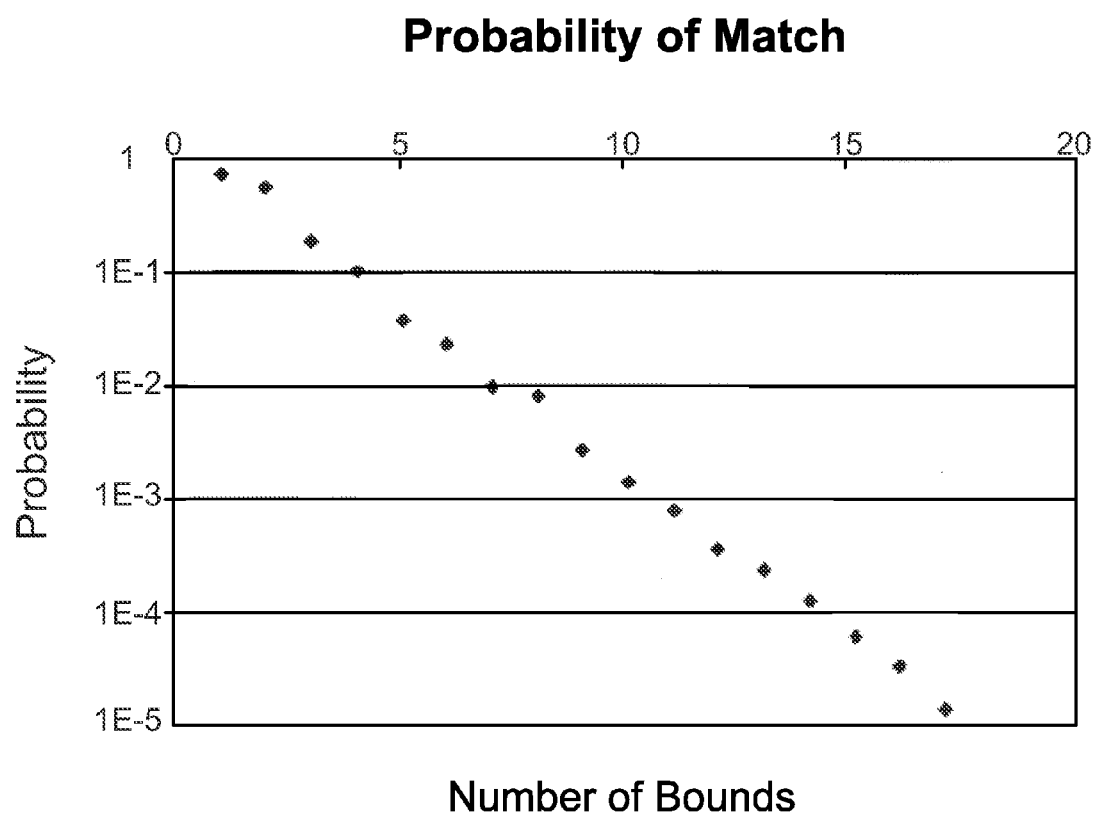
FIG. 16 shows a plot of the likelihood of a distribution with the same sigma as the distribution shown in FIG. 11, producing two identical finger prints and plotted as a function of the number of boundaries in the system.

For a distribution with sigma of about 1/256 of the range of the analog signal input and a desired number of discernable values within that range of about 4, a measurement precision of 10 bits is required. For example, the actual IC measured and shown in FIGS. 4a-4c would correspond to a sigma of 7 mV and a DAC precision of ~1.76 mV. Such measurements taken on-chip are routine and do not require any extraordinary effort. An empirical study was made for four ICs with functionally identical circuits. The mean variation across all four ICs tested was 8 mV. However, as shown in FIG. 11, a significant number of boundaries are found near the mean of the distribution, and if those boundaries are not used for signature detection, the precision requirement for the measurement can be reduced. For instance, in the data analyzed, if the variation between the average boundary value and a specific boundary value is 10 mV or more, we see that there are 17 boundaries that match that requirement out of a possible 70. A distribution was generated in which the same sigma as determined empirically from FIG. 11 was used to produce a statistically relevant sample of random data on a normal distribution. This data was then binned at a 7 mV increment, which corresponds to an 8-bit resolution DAC. This data was then sampled and the likelihood of that distribution producing two identical fingerprints was plotted as a function of the number of boundaries in the system. The plot is shown in FIG. 16. FIG. 16 shows that there is a strongly exponential drop in the probability of two identical chips while testing with DACs of 8-bit precision. When there are just 17 boundaries the probability is 1E-5. Continuing along this predicted path, the probability of finding two identical chips with 40 boundaries is 1E-11 and it will reach 1E-40 with 125 boundaries. The expectation is that we will be able to achieve 125 boundaries with about 30 polymorphic gates, which is a very small number in relation to the total number of gates or equivalent transistors on an integrated circuit.

Temperature Dependence:

It is known that there is strong temperature dependence for the analog functionality of integrated circuits. It is expected that there will also be a temperature shift of the functional boundaries of the circuits disclosed herein. This measurement has not been done at this point, but it is expected that such a measurement will lead to a correction table for the boundary values.

The Configuration Parameter: Other Fingerprint Domains

The configuration parameter in the foregoing description is a static analog voltage, but there are other analog domains that can be interpreted and converted to the digital function domain. Examples of these are given in this non-inclusive list: frequency, time, current, temperature, pressure, flux of ionizing radiation, electrical load.

As such, the configuration parameter need not necessarily be voltage related. For example, some GaN devices are sensitive to changes in pressure in terms of changing their functionality. Also, the present invention has been described in terms of using CMOS technologies, and those skilled in the art will appreciate the relationship between using voltage control and CMOS. And while CMOS gates and circuits are commonly used in digital technology, there is no reason for necessarily excluding bipolar devices, for example, from consideration. In bipolar devices the configuration parameter can be represented by a current value rather than a voltage value. Using AE, the configuration parameter can also be a frequency or electrical load, so that a circuit designed using AE, if the frequency of the analog input changes or alternatively if the load changes, the function performed by the circuit changes.

So while this technology has been described using embodiments where the configuration parameter is voltage-related, it should be appreciated that the configuration parameter can be pressure, load, current, frequency, and/or voltage related.

An Exemplary Polymorphic Gate

Figure 12:
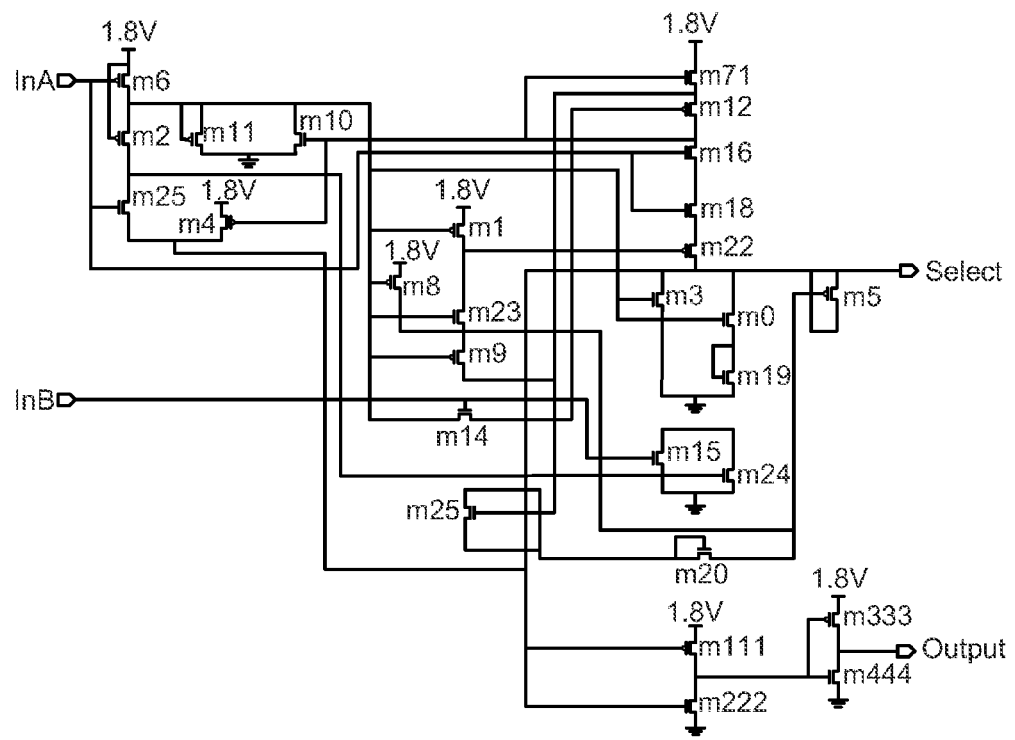
FIG. 12 is a block diagram of a six function polymorphic gate.

FIG. 12 depicts a polymorphic gate 10 which takes on six different useful functions (which are separated by non-functional regions) in response to changing its bias voltage (which is shown as signal 'Select' in the figure). So if the DAC 12 is utilized to generate the analog voltage on wire 14 which is connected to signal Select, then by applying numbers to the associated DAC, the boundary conditions associated with the depicted polymorphic gate 10 can be determined as described above.

Extracting the Numeric Values of the Boundary Conditions

Figure 14:
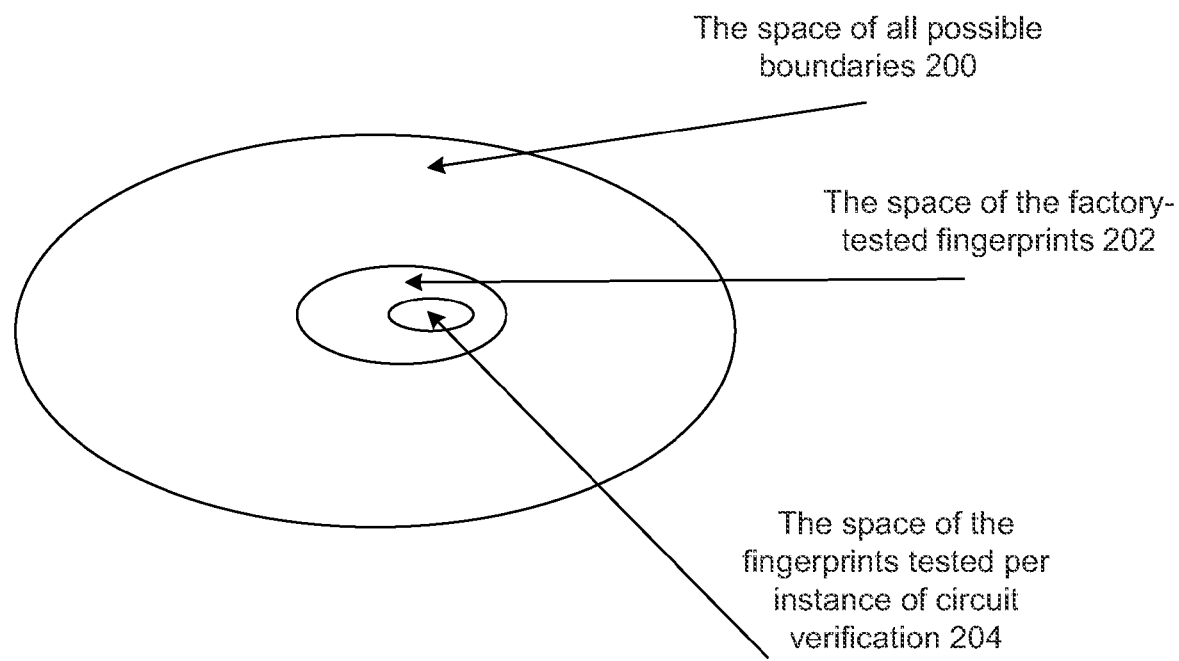
FIG. 14 is a diagram showing the set of all possible boundary conditions which could exist, the set of boundary conditions determined at initial manufacture (the fingerprint of the corresponding device or circuit) and the set of boundary conditions are tested during a given test when the fingerprinted device or circuit is being utilized in the field (or 'wild').

Given a suitably complex circuit having a thousand circuits each having six boundary conditions, there could easily be $10^{18}$ boundary conditions which could be examined. Assume, for example, that the circuit in shown in FIG. 13 has a thousand or more black box gates $10_{1-1000}$ as opposed to five depicted black box gates $10_{1-5}$ and assume that each black box gate has more than just a few boundary conditions associated therewith since polymorphic gates are preferably utilized. Such a complex circuit has a large set of possible boundary conditions and having a large set of possible boundary conditions which could be examined helps to ensure that a device using this technology cannot be spoofed, since it takes a finite amount of time to determine even one boundary condition, the prospect of examining all of them reasonably quickly becomes an impossibility. This space (of all possible boundary conditions) is labeled 200 in FIG. 14.

So instead of examining all of them, some reasonably sized subset of all of the possible boundary conditions is examined by first setting all of the configuration inputs $A_0, A_1, \ldots A_{m-1}$ to their nominal working values ($Ac_{nom}$ which is typically midway between $Ac_{min}$ and $Ac_{max}$ for the function f to be tested). This space is labeled 202 in FIG. 14. Then for each of the configuration inputs to be tested, the configuration input value A is adjusted using a stepping algorithm designed to quickly find the associated values of $Ac_{min}$ and $Ac_{max}$ (assuming that both $Ac_{min}$ and $Ac_{max}$ are of interest) discussed in greater detail below. This process is repeated for each function f associated with each configuration input $A_0, A_1, \ldots A_{m-1}$ to be tested to arrive at the set of numeric values which define the reasonably sized subset of all of the possible boundary conditions. The numeric values preferably correspond to the values taken by the DACs 14 when (or immediately before) the complex circuit produces an anomalous result based on inputted hypothetical data to the complex circuit. Assume that $10^{14}$ of the $10^{40}$ boundary conditions are actually measured (and stored for safe keeping) for a particular instantiation of the complex circuit. See space 202 in FIG. 14.

After a particular instantiation of the complex circuit is the released into the "wild" in a piece of military or commercially sensitive equipment, the piece of military or commercially sensitive equipment can be tested to determine whether the original instantiation of the complex circuit still resides in the piece of military or commercially sensitive equipment. Testing one to two thousand of the boundary conditions should be enough to satisfying one with a high degree of certainty that either the original complex circuit is still in place or alert one to the fact that the original complex circuit has been replaced with a rogue version of same. This space is labeled 204 in FIG. 14. Since a reverse engineer who got access to the complex circuit would not know which subset 202 of the set 200 of all possible boundary conditions had been tested, so the reverse engineer would be forced to try to find every member of set 200 if they are to successfully spoof the complex circuit so that it returns the expected values when the subset 204 is tested.

Figure 15:
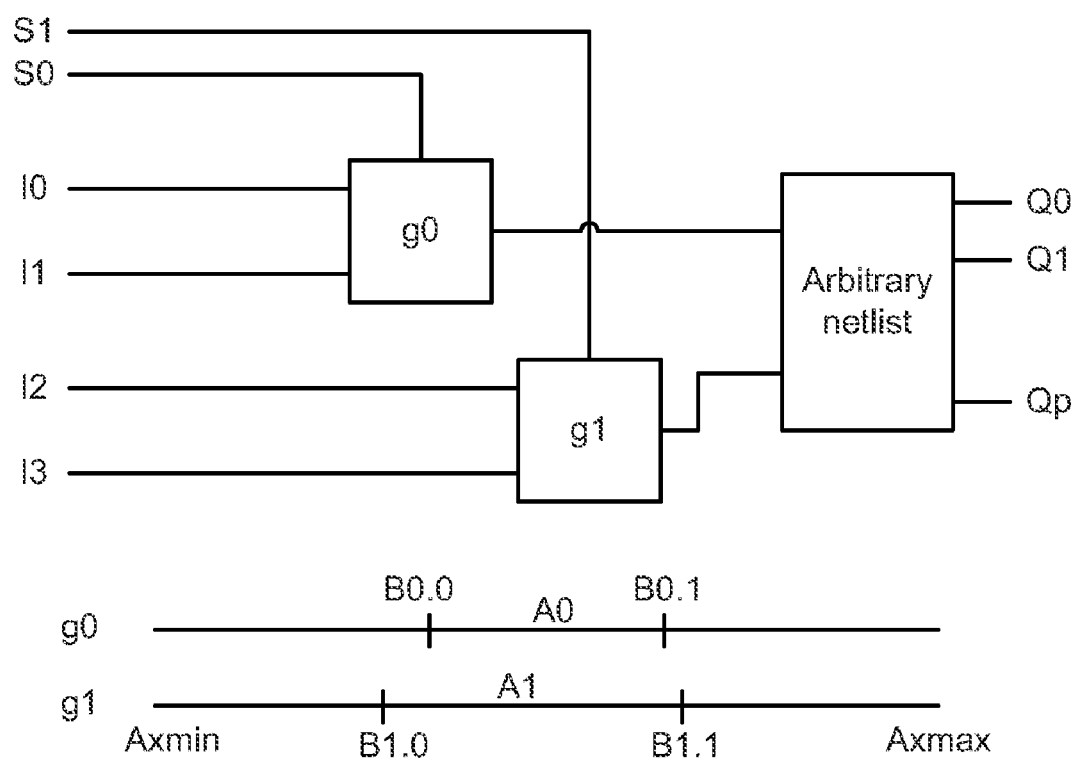
FIG. 15 is a depiction of two gates each having a single function f having an associated configured range ($Ac_{min}$ to $Ac_{max}$).

FIG. 15 depicts two gates each having a single function f having an associated configured range ($Ac_{min}$ to $Ac_{max}$). For ease of description, the subscripts in this figure for the boundaries B are i.j, where i refers subscript of the corresponding gate g and j is 0 for $Ac_{min}$ and 1 for $Ac_{max}$. The procedure for identifying the set of fingerprints involves:

1. Set $S_1$ to approximately $(B_{1.1}-B_{1.0})/2$ (i.e., the mid-point of range $A_1$) where these range boundaries are estimated because they were inputs to the EA.
2. Search downward for S0 to identify when the overall function F(I) no longer corresponds to the intended function, this search is performed using the so-called "binary search" method. The result of this search is fingerprint data $B_{0.0}$.
3. Search upward to identify $B_{0.1}$ in a manner symmetric to the above.
4. Set S0 to $(B_{0.1}-B_{0.0})/2$ using the measured values of $B_{0.1}$ and $B_{0.0}$.
5. Search for boundaries $B_{1.0}$ and $B_{1.1}$ in a fashion repeating the algorithm above.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to those skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied there from. Applicant has made this disclosure with respect to the current state of the art, but also contemplate advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) for . . . ".

What is claimed is:

1. A method of uniquely identifying instantiations of functionally equivalent circuits comprising:
expressing small manufacturing tolerance related-differences between particular instantiations of the functionally equivalent circuits in terms of a plurality of multi-bit numbers, each multi-bit number being associated with a particular gate or a group of gates of an instantiation of said functionally equivalent circuits;
determining said multi-bit numbers for a particular instantiation of said functionally equivalent circuits, said multi-bit numbers serving to uniquely identify said particular instantiation of said functionally equivalent circuits from other instantiations of said functionally equivalent circuits;
storing the multi-bit numbers for said particular instantiation of said functionally equivalent circuits;
installing said particular instantiation of said functionally equivalent circuits in an item of equipment; and
testing said item of equipment for a presence of said particular instantiation of said functionally equivalent circuits in said item of equipment by determining said multi-bit numbers for the particular instantiation of said

TABLE I

The functional range boundary data including both the simulated (Columns with (Nom) listed) and measured (Columns with a (Chip x) indicated for the data represented by FIGs. 4a and 4b.

| Circuit | Function | Arbitrary | Inf. Lim (Nom) | Mid-Point (Nom) | Sup. Lim (Nom) | Inf. Lim. (Chip 1) | Sup. Lim. (Chip 1) | Inf. Lim. (Chip 2) | Sup. Lim. (Chip 2) | Inf. Lim. (Chip 3) | Sup. Lim. (Chip 3) | Inf. Lim. (Chip 4) | Sup. Lim. (Chip 4) |
|---|---|---|---|---|---|---|---|---|---|---|---|---|---|
| Circuit82 | AND | 1 | 0 | 0.2 | 0.4 | 0.04 | 0.486 | 0.04 | 0.489 | 0.04 | 0.47 | 0.04 | 0.493 |
| (pbufa_bufb) | XNOR | 2 | | 0.5 | | 0.533 | 0.588 | 0.534 | 0.602 | 0.52 | 0.566 | 0.53 | 0.614 |
| | NAND B1 | 3 | 0.6 | 0.65 | 0.7 | 0.641 | 0.76 | 0.645 | 0.746 | 0.644 | 0.749 | 0.647 | 0.764 |
| | BUFA | 4 | 0.8 | 0.85 | 0.9 | 0.788 | 0.956 | 0.79 | 0.938 | 0.809 | 0.878 | 0.803 | 0.933 |
| | OR | 5 | | 1 | | 1.021 | 1.092 | 1.028 | 1.099 | 1.053 | 1.097 | 1.01 | 1.11 |
| | BUFB | 6 | 1.1 | 1.2 | 1.3 | 1.156 | 1.341 | 1.16 | 1.355 | 1.174 | 1.341 | 1.175 | 1.368 |
| | GROUND | 7 | | 1.5 | | 1.478 | 1.8 | 1.485 | 1.8 | 1.488 | 1.8 | 1.525 | 1.8 |
| Circuit87 | OR | 1 | | 0.4 | | 0.03 | 0.345 | 0.03 | 0.36 | 0.03 | 0.353 | 0.03 | 0.364 |
| (pbufa_orinv) | BUFA | 2 | | 0.5 | | 0.492 | 0.583 | 0.488 | 0.566 | 0.509 | 0.584 | 0.514 | 0.588 |
| | ANDB2 | 3 | 0.6 | 0.65 | 0.7 | 0.666 | 0.804 | 0.634 | 0.804 | 0.666 | 0.804 | 0.669 | 0.804 |
| | INVB | 4 | 0.8 | 0.85 | 0.9 | 0.89 | 0.945 | 0.921 | 0.999 | 0.868 | 0.955 | 0.898 | 0.959 |
| | ORB2 | 5 | 1 | 1.05 | 1.1 | 0.976 | 1.108 | 1.026 | 1.152 | 0.972 | 1.132 | 1.007 | 1.123 |
| | VDD | 6 | | 1.5 | | 1.19 | 1.8 | 1.211 | 1.8 | 1.161 | 1.8 | 1.198 | 1.8 |
| Circuit38 | NAND | 1 | | 0 | | 0.07 | 0.65 | 0.07 | 0.66 | 0.07 | 0.659 | 0.07 | 0.66 |
| (pand_nand) | INVB | 2 | | 0.7 | | 0.677 | 0.862 | 0.684 | 0.879 | 0.674 | 0.885 | 0.669 | 0.889 |
| | NOR | 3 | | 0.9 | | 0.905 | 1.048 | 0.909 | 1.036 | 0.916 | 1.056 | 0.931 | 1.062 |
| | XNOR | 4 | | 1.1 | | 1.07 | 1.163 | 1.077 | 1.17 | 1.068 | 1.171 | 1.084 | 1.177 |
| | AND | 5 | | 1.8 | | 1.176 | 1.8 | 1.181 | 1.8 | 1.192 | 1.8 | 1.196 | 1.8 |
| Circuit100 | AND | 1 | 0 | 0.3 | 0.6 | 0.068 | 0.896 | 0.068 | 0.908 | 0.068 | 0.898 | 0.068 | 0.902 |
| (pand_or) | BUFB | 2 | | 0.9 | | 0.922 | 1.118 | 0.943 | 1.129 | 0.934 | 1.135 | 0.94 | 1.143 |
| | OR | 3 | | 1.2 | | 1.134 | 1.366 | 1.159 | 1.383 | 1.155 | 1.391 | 1.156 | 1.39 |
| | VDD | 4 | | 1.5 | | 1.384 | 1.8 | 1.406 | 1.8 | 1.409 | 1.8 | 1.414 | 1.8 |
| Circuit30 | NAND | 1 | | 0 | | 0.04 | 0.15 | 0.04 | 0.13 | 0.04 | 0.13 | 0.04 | 0.13 |
| (pnand_or) | VDD | 2 | | 0.5 | | 0.22 | 1.315 | 0.2 | 1.296 | 0.2 | 1.306 | 0.2 | 1.303 |
| | OR | 3 | | 1.8 | | 1.392 | 1.8 | 1.411 | 1.8 | 1.413 | 1.8 | 1.414 | 1.8 |
| Circuit50 | NAND | 1 | | 0 | | 0.04 | 0.283 | 0.04 | 0.29 | 0.04 | 0.308 | 0.04 | 0.32 |
| (pnand_xor) | XOR | 2 | | 0.7 | | 0.399 | 1.797 | 0.404 | 1.79 | 0.419 | 1.796 | 0.409 | 1.787 |
| | NAND | 3 | | 1.8 | | 1.805 | 1.805 | 1.794 | 1.8 | 1.804 | 1.804 | 1.797 | 1.8 |
| Circuit44 | NAND | 1 | | 0 | | 0.03 | 0.465 | 0.03 | 0.464 | 0.03 | 0.47 | 0.03 | 0.457 |
| (pbufa_nand) | ORB2 | 2 | | 0.65 | | 0.639 | 0.688 | 0.636 | 0.7 | 0.634 | 0.698 | 0.631 | 0.687 |
| | BUFA | 3 | | 0.9 | | 0.717 | 1.524 | 0.73 | 1.522 | 0.718 | 1.517 | 0.718 | 1.504 |
| | AND | 4 | | 1.6 | | 1.645 | 1.8 | 1.643 | 1.8 | 1.633 | 1.8 | 1.633 | 1.8 |
| Circuit59 | NOR | 1 | | 0 | | 0.03 | 0.334 | 0.03 | 0.339 | 0.03 | 0.328 | 0.03 | 0.327 |
| (pbufa_nor) | INVA | 2 | | 0.5 | | 0.424 | 0.542 | 0.428 | 0.54 | 0.426 | 0.527 | 0.424 | 0.542 |
| | BUFA | 3 | | 1.8 | | 0.77 | 1.8 | 0.779 | 1.8 | 0.786 | 1.8 | 0.788 | 1.8 | functionally equivalent circuits in said item of equipment and comparing the results of said determination of said multi-bit numbers with the stored multi-bit numbers corresponding to the particular instantiation of said functionally equivalent circuits originally installed in said item of equipment.

2. The method of claim 1 wherein said instantiations of functionally equivalent circuits each comprise a separate instantiation of an integrated circuit device.

3. The method of claim 2 wherein each multi-bit number is associated with a gate or a group of gates, said gate or group of gates being functionally configured by an analog control or configuration signal generated by a DAC responsive to the multi-bit number associated with said gate or group of gates.

4. The method according to claim 1, wherein the functionally equivalent circuits are digital circuits.

5. The method according to claim 1, wherein the multi-bit numbers are parameters selected from the group consisting of voltage parameter, pressure parameter, load parameter, current parameter, and frequency parameter.

6. The method according to claim 1, wherein the small manufacturing tolerance related-differences between particular instantiations of the functionally equivalent circuits are chip-to-chip variations and within-chip variations.

7. The method according to claim 1, wherein the expressing and the testing are conducted at a controlled temperature.

* * * * *